US011005464B1

(12) United States Patent
Lin

(10) Patent No.: US 11,005,464 B1
(45) Date of Patent: May 11, 2021

(54) DELAY LINE CIRCUIT

(71) Applicant: Taiwan Semiconductor Manufacturing Co., Ltd., Hsinchu (TW)

(72) Inventor: Yu-Tso Lin, New Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/830,292

(22) Filed: Mar. 26, 2020

(51) Int. Cl.
  *H03K 5/14* (2014.01)
  *H03K 5/131* (2014.01)
  *H03K 5/135* (2006.01)
  *H03K 5/00* (2006.01)

(52) U.S. Cl.
  CPC .............. *H03K 5/14* (2013.01); *H03K 5/131* (2013.01); *H03K 5/135* (2013.01); *H03K 2005/00045* (2013.01)

(58) Field of Classification Search
  None
  See application file for complete search history.

(56) References Cited

U.S. PATENT DOCUMENTS

| | | | | |
|---|---|---|---|---|
| 9,160,345 B1* | 10/2015 | Gorecki | ................ | H03L 7/0807 |
| 9,197,398 B2* | 11/2015 | Yang | ..................... | H03L 7/0812 |
| 9,667,252 B1* | 5/2017 | Lee | ........................ | H03K 5/1565 |
| 10,211,841 B2* | 2/2019 | Zerbe | ...................... | H03L 7/091 |
| 2016/0182060 A1* | 6/2016 | Im | ............................. | H03L 7/08 327/158 |
| 2017/0237419 A1* | 8/2017 | Clara | ....................... | H03M 1/06 327/231 |
| 2019/0229712 A1* | 7/2019 | Suzuki | .................... | H03K 3/017 |
| 2019/0386649 A1* | 12/2019 | Chen | ......................... | G06F 1/04 |

* cited by examiner

*Primary Examiner* — Lincoln D Donovan
*Assistant Examiner* — Khareem E Almo
(74) *Attorney, Agent, or Firm* — JCIPRNET

(57) ABSTRACT

The disclosure provides a delay line circuit including an output stage. The output stage includes a first inverter cell, a second inverter cell, a correction circuit, and a first switch capacitor array. The input terminal of the first inverter cell receives a reference clock signal. The input terminal of the second inverter cell is coupled with the output terminal of the first inverter cell. The first terminal of the correction circuit is coupled with the output terminal of the first inverter cell, and the second terminal of the correction circuit is coupled with a ground, wherein the correction circuit corrects a duty cycle of the delay line circuit. The first terminal of the first switch capacitor array is coupled with the output terminal of the second inverter cell, and the second terminal of the first switch capacitor array is coupled with the ground.

20 Claims, 8 Drawing Sheets

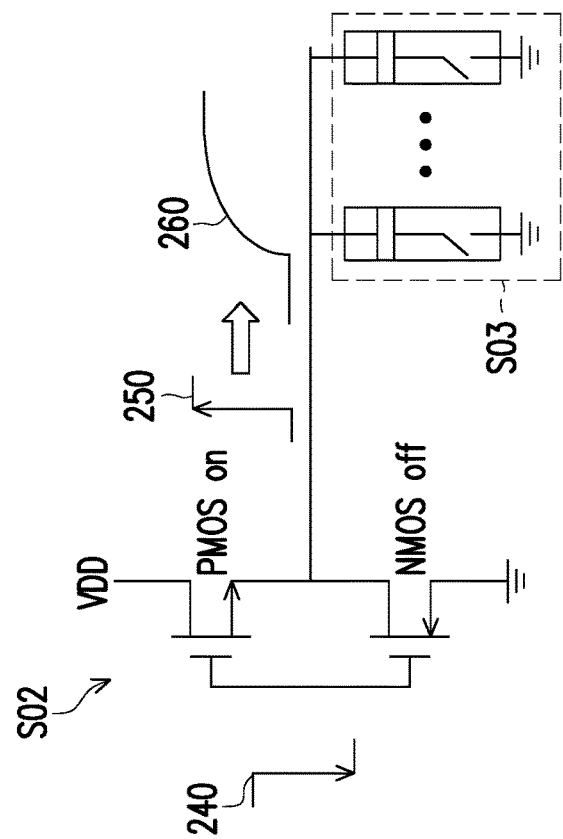
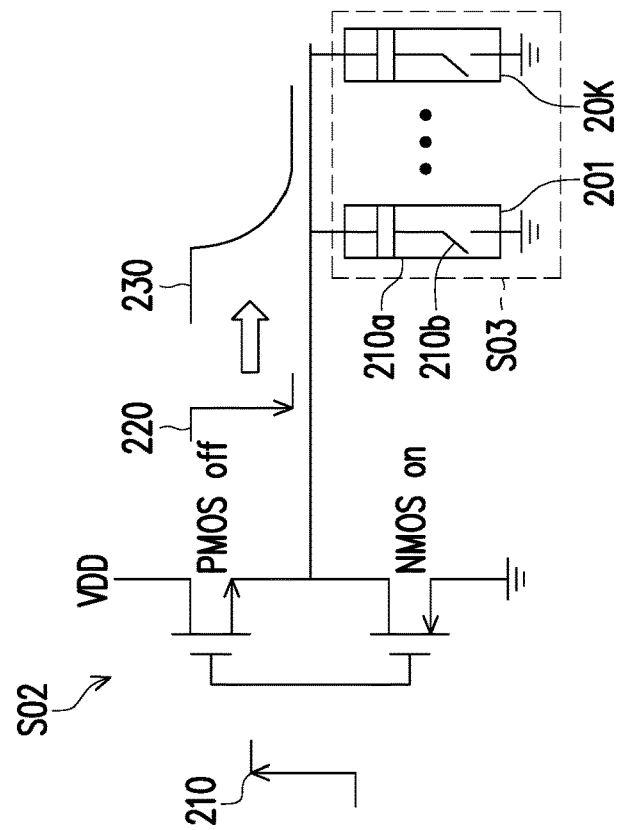
FIG. 2B
FIG. 2A

DELAY LINE CIRCUIT

BACKGROUND

A digitally-controlled delay line (DCDL) circuit with multiple stages is widely used in various applications (e.g., multi-phase outputs). However, since the output of each stage of the DCDL contributes slightly unbalanced rise/fall time, the output duty cycle of the DCDL would be unsatisfying. Therefore, to people with ordinary skills in the art it is crucial to design a mechanism for correcting the output duty cycle of the DCDL.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2A shows a distorted falling edge of the output of the output stage according to an embodiment of the disclosure.

FIG. 2B shows a distorted rising edge of the output of the output stage according to FIG. 2A.

DESCRIPTION OF THE EMBODIMENTS

Figure 1:
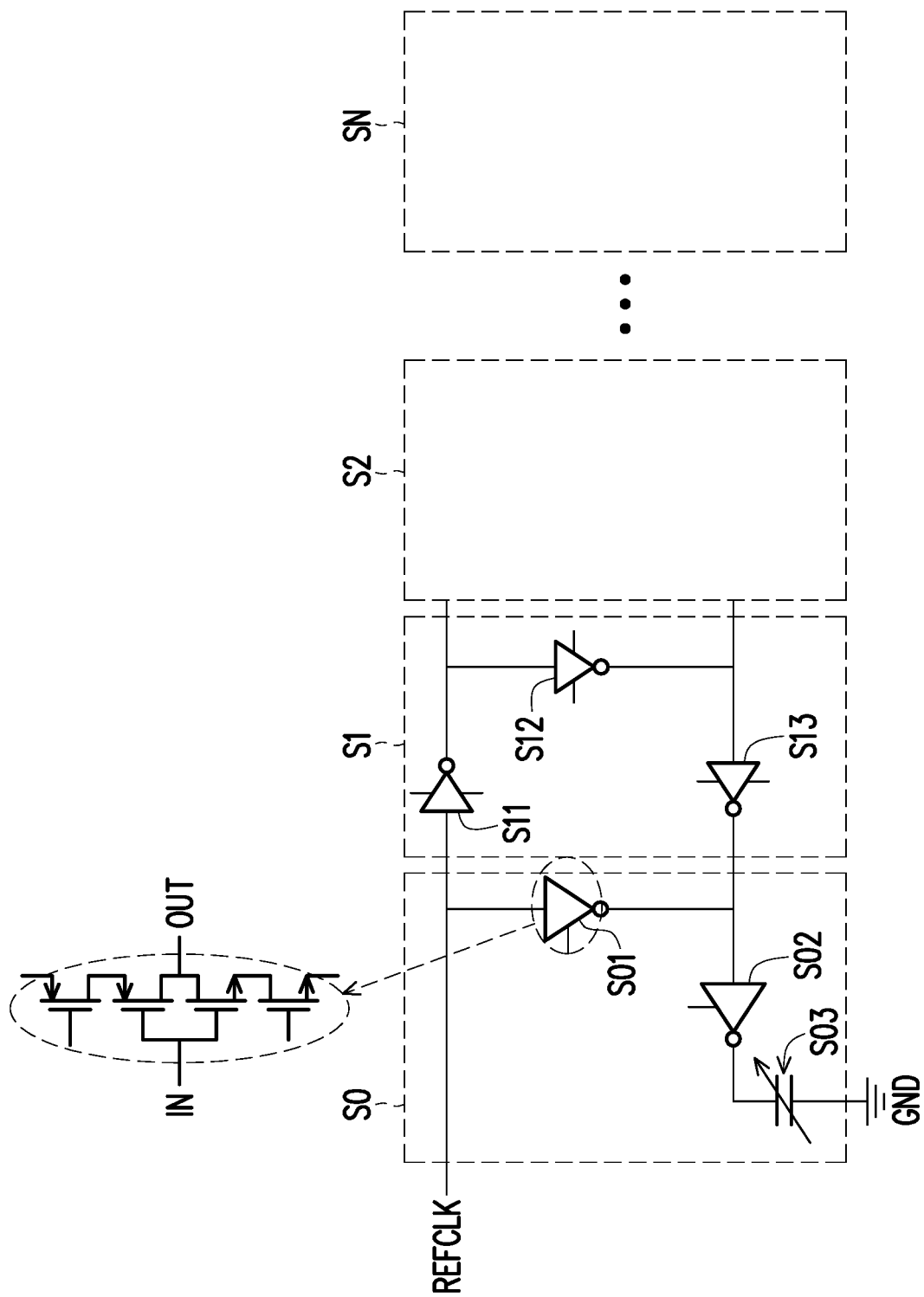
FIG. 1 shows a delay line circuit with a first switch capacitor array disposed at the output stage according to an embodiment of the disclosure.

The following disclosure provides many different embodiments, or examples, for implementing different features of the present disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

See FIG. 1, which shows a delay line circuit with a first switch capacitor array disposed at the output stage according to an embodiment of the disclosure. In FIG. 1, the delay line circuit 100 may be a DCDL and includes an output stage S0 and a plurality of serially connected stages S1, S2, . . . SN coupled with the output stage S0.

The output stage S0 includes a first inverter cell S01, a second inverter cell S02, and a first switch capacitor array S03. The first inverter cell S01 may be implemented as a regular inverter or a current starved inverter whose structure has been shown in FIG. 1. In addition, all of the inverter cells discussed in the disclosure may be implemented as the current starved inverter, but the disclosure is not limited thereto. In FIG. 1, the first inverter cell S01 has an input terminal and an output terminal, wherein the input terminal of the first inverter cell S01 receives a reference clock signal REFCLK to be delayed. The second inverter cell S02 (which may be referred to as an output inverter of the delay line circuit 100) has an input terminal and an output terminal, wherein the input terminal of the second inverter cell S02 is coupled with the output terminal of the first inverter cell S01.

The first switch capacitor array S03 has a first terminal and a second terminal, wherein the first terminal of the first switch capacitor array S03 is coupled with the output terminal of the second inverter cell S02, and the second terminal of the first switch capacitor array S03 is coupled with a ground GND. The first switch capacitor array S03 may include a plurality of switch capacitor units, and each switch capacitor unit may include a capacitor and a switch.

In one embodiment the capacitor has a first end and a second end, wherein the first end of the capacitor forms the first terminal of the first switch capacitor array S03 and is coupled with the output terminal of the second inverter cell S02. The switch has a first end and a second end, wherein the first end of the switch is coupled with the second end of the capacitor, and the second end of the switch is coupled with the ground GND. In another embodiment, wherein the first end of the switch forms the first terminal of the first switch capacitor array S03 and is coupled with the output terminal of the second inverter cell S02. The first end of the capacitor is coupled with the second end of the switch, and the second end of the capacitor is coupled with the ground GND.

In the present embodiment, each stage S1-SN has a first input terminal, a first output terminal, a second input terminal, and a second output terminal. For the stage S1 (i.e., the $1^{st}$ stage of the stages S1-SN), the first input terminal of the stage S1 is coupled with the input terminal of the first inverter cell S01, the first output terminal of the stage S1 is coupled with the first input terminal of the stage S2 (i.e., a $2^{nd}$ stage of the stages S1-SN), the second input terminal of the stage S1 is coupled with the second output terminal of the stage S2, and the second output terminal of the stage S1 is coupled with the output terminal of the first inverter cell S01.

For an $i^{th}$ stage (wherein i is an integer ranges between 2 and a number of the stages S1-SN) of the stages S1-SN, the first input terminal of the $i^{th}$ stage is coupled with the first output terminal of an $(i-1)^{th}$ stage of the stages S1-SN, the first output terminal is coupled with the first input terminal of an $(i+1)^{th}$ stage of the stages S1-SN, the second input terminal of the P stage is coupled with the second output terminal of the $(i+1)^{th}$ stage, and the second output terminal of the $i^{th}$ stage is coupled with the second input terminal of the $(i-1)^{th}$ stage.

In FIG. 1, each of the stages S1-SN may include a third inverter cell, a fourth inverter cell, and a fifth inverter cell. The third inverter cell has an input terminal and an output terminal, wherein the input terminal of the third inverter cell forms the first input terminal of the respective stage, the output terminal of the third inverter cell forms the first output terminal of the respective stage. The fourth inverter cell has an input terminal and an output terminal, wherein the input terminal of fourth inverter cell is coupled with the output terminal of the third inverter cell, the output terminal of the fourth inverter cell forms the second input terminal of the respective stage. The fifth inverter cell has an input terminal and an output terminal, wherein the input terminal of the fifth inverter cell is coupled with the output terminal of the fourth inverter cell, and the output terminal of the fifth inverter cell forms the second output terminal of the respective stage.

Taking the stage S1 as an example, the stage S1 includes a third inverter cell S11, a fourth inverter cell S12, and a fifth inverter cell S13. The third inverter cell S11 has an input terminal and an output terminal, wherein the input terminal of the third inverter cell S11 forms the first input terminal of the stage S1, the output terminal of the third inverter cell S11 forms the first output terminal of the stage S1. The fourth inverter cell S12 has an input terminal and an output terminal, wherein the input terminal of fourth inverter cell S12 is coupled with the output terminal of the third inverter cell S11, the output terminal of the fourth inverter cell S12 forms the second input terminal of the stage S1. The fifth inverter cell S13 has an input terminal and an output terminal, wherein the input terminal of the fifth inverter cell S13 is coupled with the output terminal of the fourth inverter cell S12, and the output terminal of the fifth inverter cell S13 forms the second output terminal of the stage S1 connected with the output terminal of the first inverter cell S01 and the input terminal of the second inverter cell S02.

In the present embodiment, since the delay line circuit 100 has the first switch capacitor array S03, the duty cycle of the delay line circuit 100 would be degraded. See FIG. 2A and FIG. 2B for further discussions.

FIG. 2A shows a distorted falling edge of the output of the output stage according to an embodiment of the disclosure. In FIG. 2A, the first switch capacitor array S03 may include switch capacitor units 201-20K having identical structures, wherein the switch capacitor unit 201 may include a capacitor 201a and a switch 201b as introduced in the above.

In FIG. 2A, in response to the rising edge 210 of the input signal, the second inverter cell S02 (which has a PMOS and an NMOS) would accordingly generate a falling edge 220. However, due to the first switch capacitor array and the MOS intrinsic physical (mobility) characteristics of the PMOS and NMOS, the falling edge 220 of the would not be as sharp as shown in FIG. 2A, but would appear as the falling edge 230 that falls more gently.

See FIG. 2B, which shows a distorted rising edge of the output of the output stage according to FIG. 2A. In FIG. 2B, in response to the rising edge 240 of the input signal, the second inverter cell S02 would accordingly generate a falling edge 250. However, due to the first switch capacitor array and the MOS intrinsic physical (mobility) characteristics of the PMOS and NMOS, the falling edge 250 of the would not be as sharp as shown in FIG. 2B, but would appear as the falling edge 260 that rises even more gently.

Figure 3:
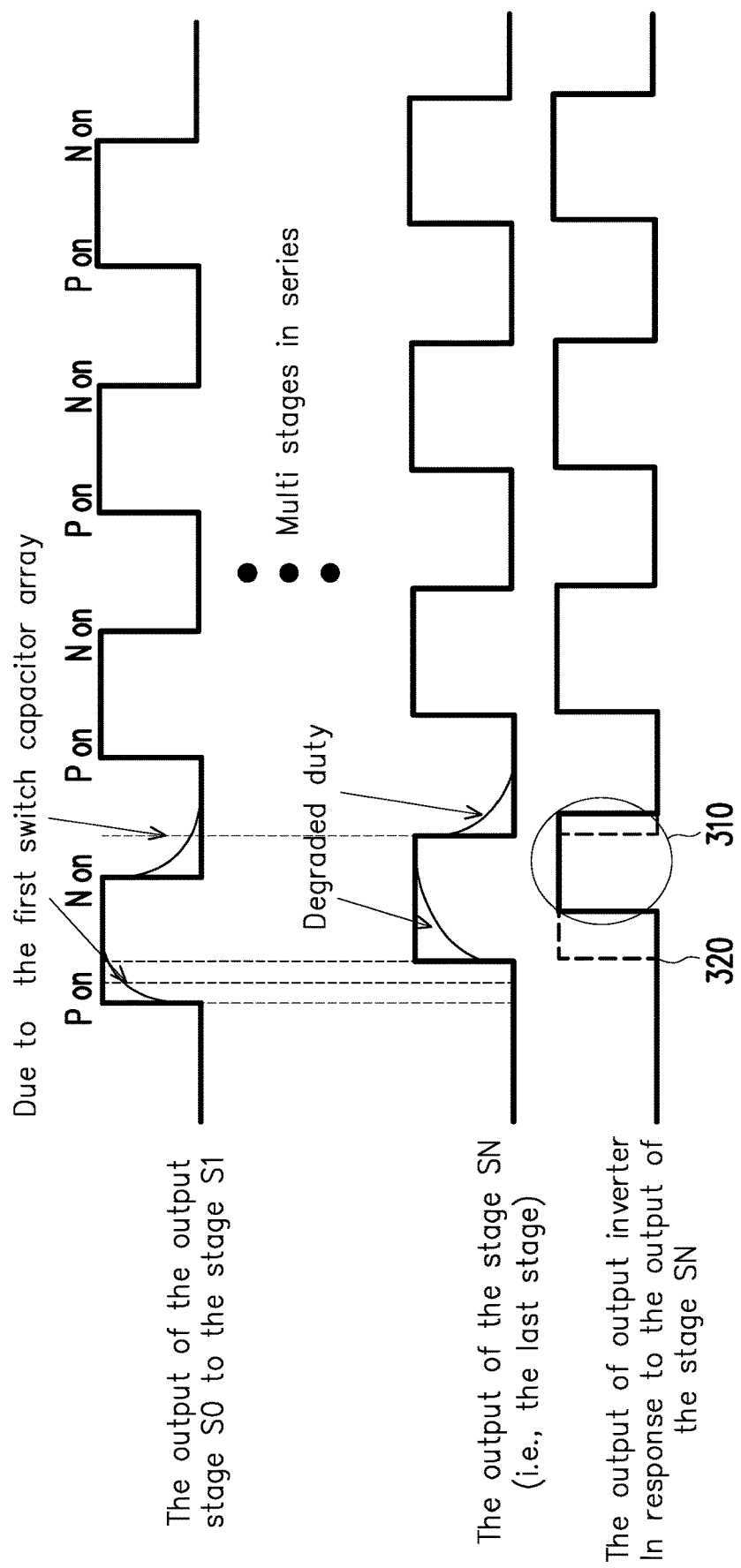
FIG. 3 shows the outputs of the output stage and each stage of the delay line circuit according to FIG. 2A and FIG. 2B.

See FIG. 3, which shows the outputs of the output stage and each stage of the delay line circuit according to FIG. 2A and FIG. 2B. As could be observed in FIG. 3, each of the outputs of the output stage S0 and the stages S1-SN contributes slightly unbalanced rise/fall time, such that the output of the output inverter (i.e., the second inverter cell S02) has a degraded duty cycle (indicated by the circle 310) compared with the original duty cycle (indicated by the dotted line 320).

Accordingly, the disclosure proposes a delay line circuit disposed with a correction circuit that is capable of correcting the duty cycle of the delay line circuit, and the details thereof would be discussed in the following.

Figure 4:
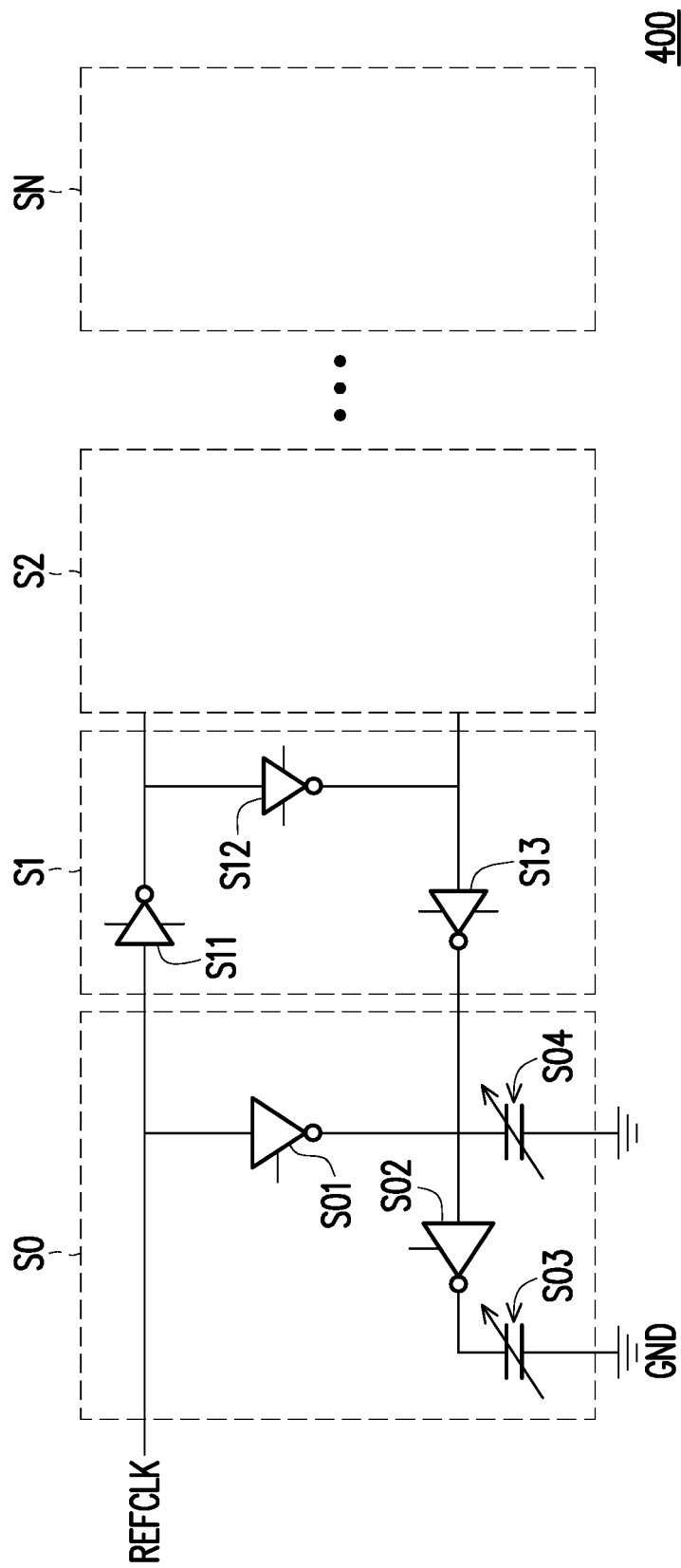
FIG. 4 show a schematic diagram of the delay line circuit according to an embodiment of the disclosure.

See FIG. 4, which show a schematic diagram of the delay line circuit according to an embodiment of the disclosure. As shown in FIG. 4, in comparison with the delay line circuit 100 in FIG. 1, the delay line circuit 400 further includes a correction circuit S04, and hence other structure/elements of the delay line circuit 400 may be referred to the discussions of FIG. 1, which would not be repeated herein.

In FIG. 4, the correction circuit S04 has a first terminal and a second terminal, wherein the first terminal of the correction circuit S04 is coupled with the output terminal of the first inverter cell S01, and the second terminal of the correction circuit S04 is coupled with the ground GND, In one embodiment, the correction circuit S04 may be implemented as a second switch capacitor array that includes a plurality of switch capacitor units, and each switch capacitor unit includes a capacitor and a switch. In one embodiment, the capacitor has a first end and a second end, wherein the first end of the capacitor forms the first terminal of the correction circuit S04 and is coupled with the output terminal of the first inverter cell S01. The switch has a first end and a second end, wherein the first end of the switch is coupled with the second end of the capacitor, and the second end of the switch is coupled with the ground GND. In another embodiment, the first end of the switch forms the first terminal of the correction circuit S04 and is coupled with the output terminal of the first inverter cell SOL. The first end of the capacitor is coupled with the second end of the switch, and the second end of the capacitor is coupled with the ground GND. For ease to understand the concept of the disclosure, the structure of the correction circuit S04 may be referred to the structure of the first switch capacitor array S03 in FIG. 2A, but the disclosure is not limited thereto.

In some embodiments, the second switch capacitor array may be designed to be identical to the first switch capacitor array S03. In other embodiments, the second switch capacitor array may be designed to be different from the first switch capacitor array S03.

Figure 5:
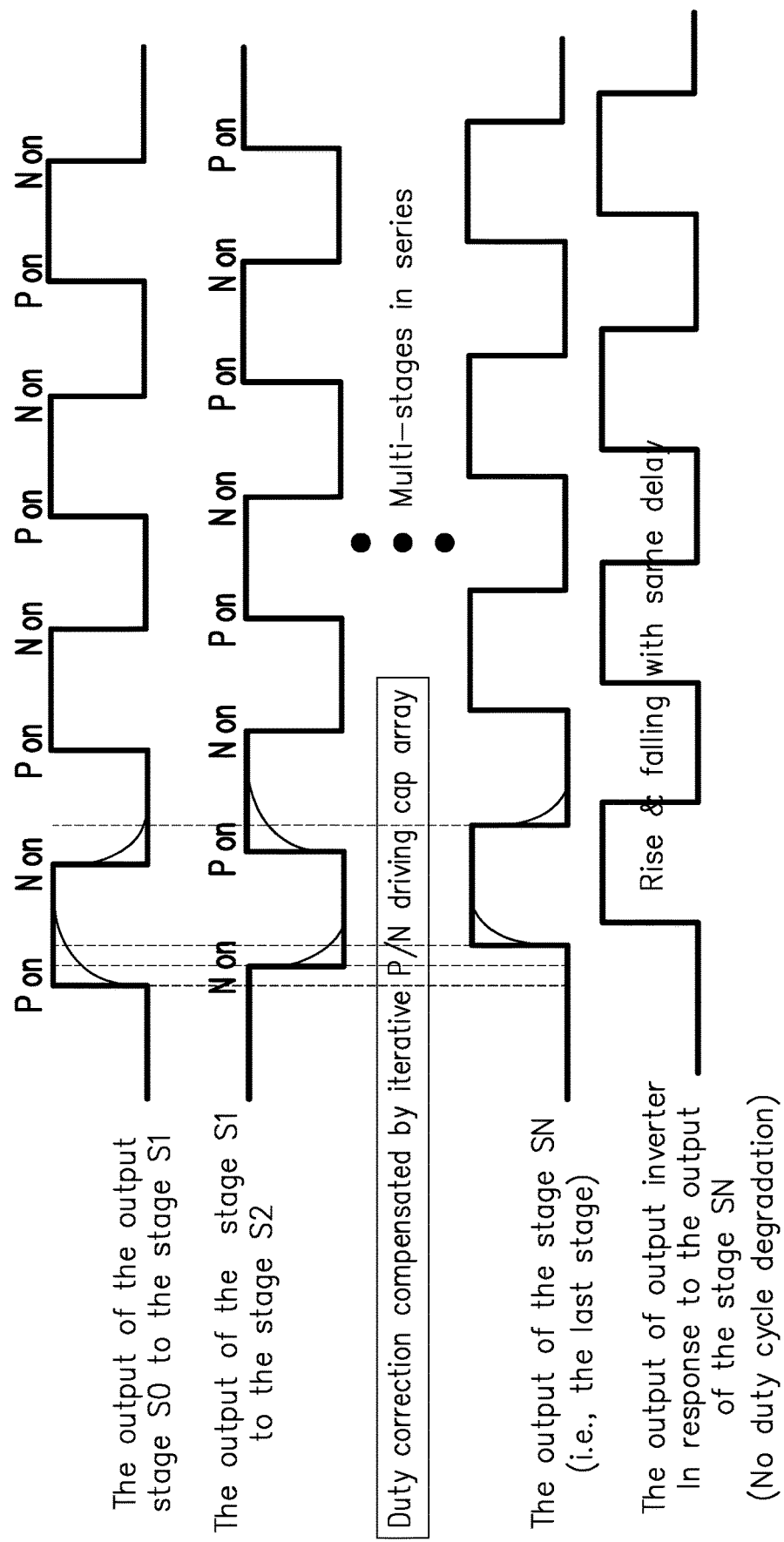
FIG. 5 shows the outputs of the output stage and each stage of the delay line circuit according to FIG. 4.

With the correction circuit S04, the duty cycle of the delay line circuit 400 could be corrected, and the related principles would be discussed in accompanying with FIG. 5.

See FIG. 5, which shows the outputs of the output stage and each stage of the delay line circuit according to FIG. 4. Typically, the rise/fall time of a PMOS is larger than an NMOS. Accordingly, the rise time is larger (due to PMOS of the previous inverter) at the input terminal of the output inverter (i.e., the second inverter cell S02) and the larger rise time is compensated by the NMOS of the output inverter at the output terminal of the output inverter. Meanwhile, the fall time is smaller (due to NMOS of the previous inverter) at the input terminal of the output inverter and the smaller fall time is compensated by PMOS of the output inverter at the output terminal of the output inverter.

Therefore, as shown in FIG. 5, the duty cycle degradation observed in FIG. 3 no longer exists in FIG. 5, which means that the duty cycle of the delay line circuit 400 has been corrected.

Further, in some embodiments, each of the inverter cells (e.g., the first/second/third/fourth/fifth inverter cells) mentioned in the previous embodiments may be replaced by an inverter cell array for allowing the delay line circuit of the disclosure to achieve a wider variety of delay time choices.

Figure 6B:
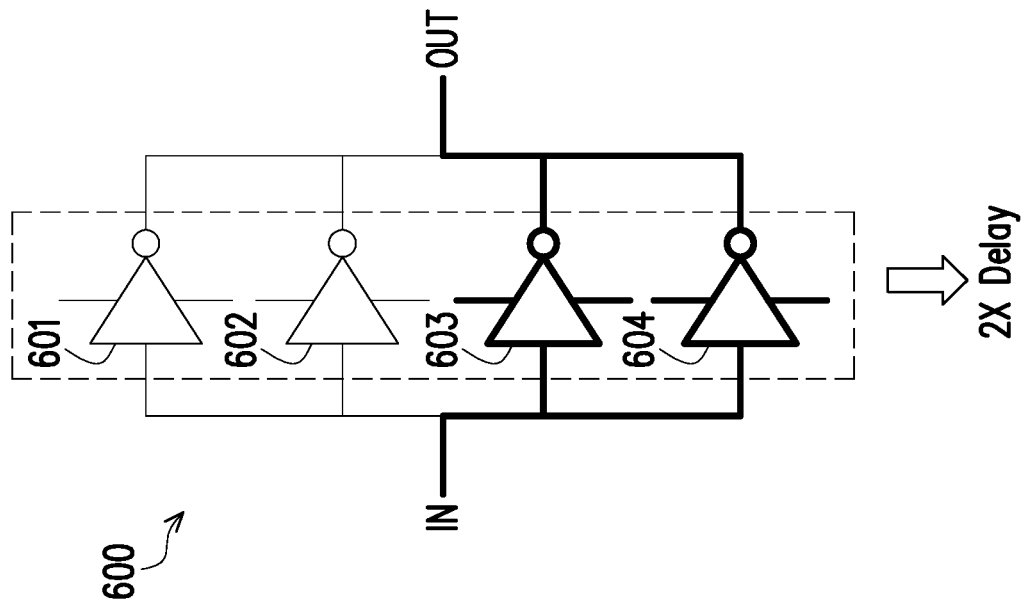
FIG. 6B shows a structure of an inverter cell array with several disabled inverter cells according to FIG. 6A.
Figure 6A:
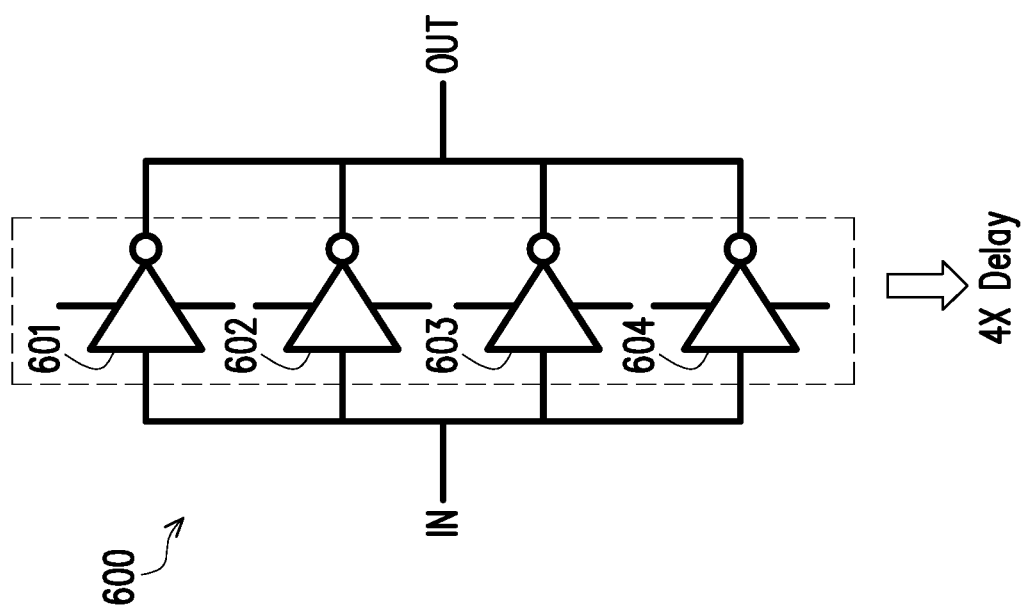
FIG. 6A shows a structure of an inverter cell array according to an embodiment of the disclosure.

See FIG. 6A, which shows a structure of an inverter cell array according to an embodiment of the disclosure. In the present embodiment, the inverter cell array 600 includes a plurality of inverter cells 601-604 connected in parallel, and all four of the inverter cells 601-604 are enabled. In various embodiments, the inverter cell array 600 and may be used to replace any of the inverter cells of the delay line circuit 400.

For example, if the inverter cell array 600 with an input terminal and an output terminal is used to replace the first inverter cell S01, the input terminal of the inverter cell array 600 may be used to receive the reference clock signal REFCLK, and the output terminal of the inverter cell array may be coupled with the input terminal of the second inverter cell S02.

For another example, if the inverter cell array 600 with an input terminal and an output terminal is used to replace the second inverter cell S02, the input terminal of the inverter cell array 600 is coupled with the output terminal of the first inverter cell S01, and the output terminal of the inverter cell 600 is coupled with the first terminal of the first switch capacitor array S03. Based on the teachings in the above, people with ordinary skills in the art may be able to derive the embodiments where one or more of the inverter cells in the delay line circuit 400 is replaced by the inverter cell array 600, which would not be further provided herein.

In FIG. 6A, if the inverter cell array 600 with 4 enabled inverter cells is used to replace the inverter cells in a certain stage of the delay line circuit 400, the certain stage may be referred to as a "4× Delay" stage.

In some embodiments, one or more of the inverter cells 601-604 in the inverter cell array 600 may be disabled based on the requirements of the user. See FIG. 6B, which shows a structure of an inverter cell array with several disabled inverter cells according to FIG. 6A. As exemplarily shown in FIG. 6B, the inverter cells 601 and 602 have been disabled. If the inverter cell array 600 with 2 enabled inverter cells is used to replace the inverter cells in a certain stage of the delay line circuit 400, the certain stage may be referred to as a "2× Delay" stage. In comparison with the structure shown in FIG. 6A, the structure shown in FIG. 6B is more suitable for an application with low frequency for having a higher delay. That is, the structure shown in FIG. 6A is more suitable for an application with high frequency than the structure in FIG. 6B for having a lower delay.

In various embodiments, an achievable delay of the delay line circuit 400 is configurable via changing a number of enabled inverter cells in the inverter cells of the inverter cell arrays 600 in one or more of the stages in the delay line circuit 400.

Figure 7:
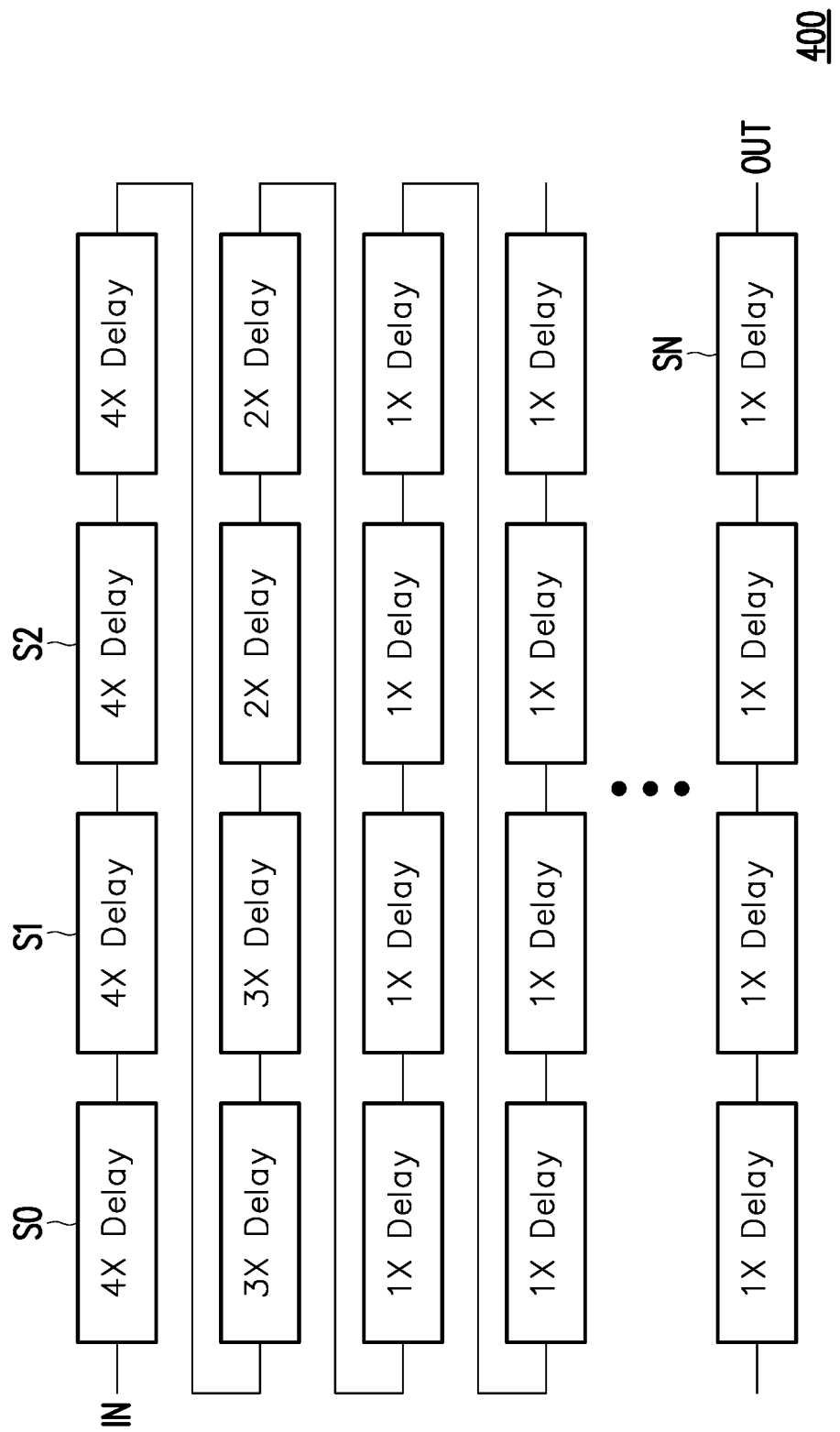
FIG. 7 shows a schematic diagram of the delay line circuit according to FIG. 4.

See FIG. 7, which shows a schematic diagram of the delay line circuit according to FIG. 4. In the present embodiment, the output stage S0 may be assumed to be a "4× Delay" stage, the stage S1 may be assumed to be a "4× Delay", the stage SN may be assumed to be a "1× Delay" stage (i.e., only one of the inverter cells of the inverter cell array 600 in the stage SN is enabled), and the meaning of other stages labelled by "2× Delay" or "3× Delay" may be understood based on the teachings in the above, which would not be further provided.

Figure 8:
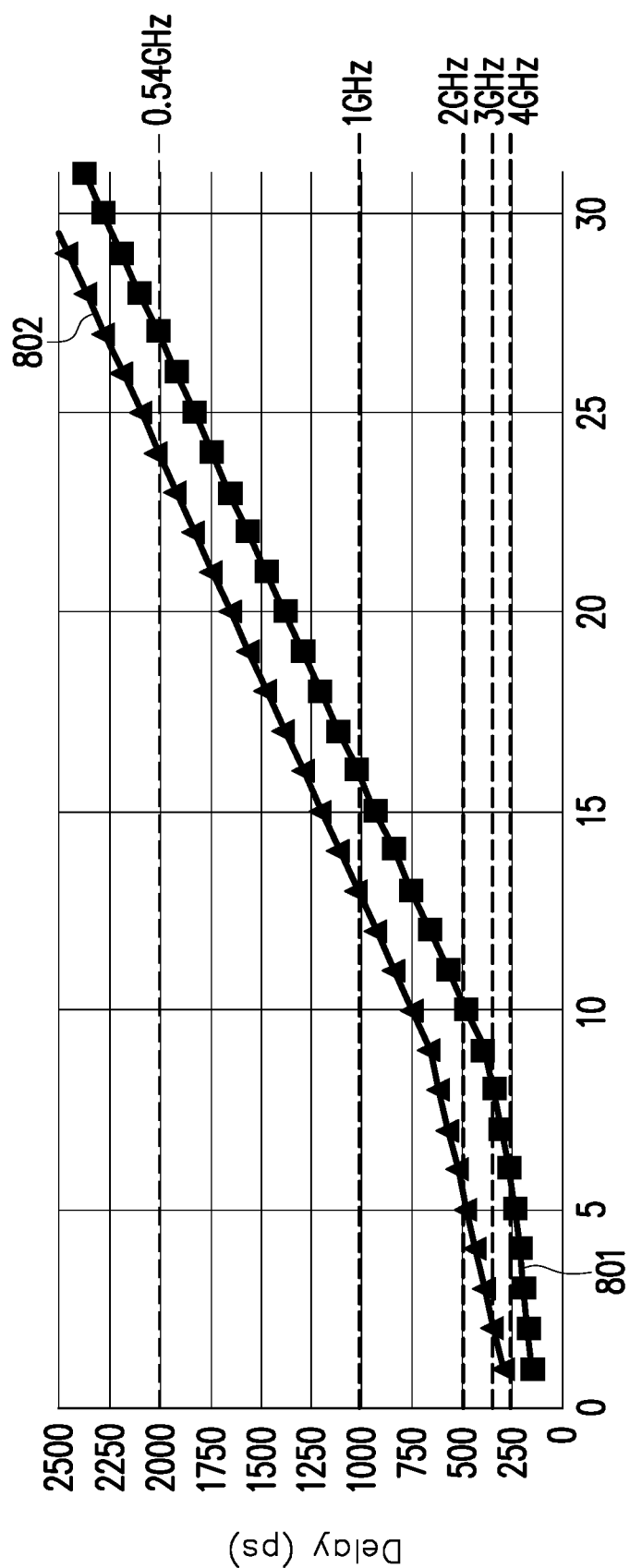
FIG. 8 shows the achievable delay of the delay line circuit according to FIG. 6 and FIG. 7.

See FIG. 8, which shows the achievable delay of the delay line circuit according to FIG. 6 and FIG. 7. In FIG. 8, the horizontal axis indicates the activated stages in the delay line circuit 400, the vertical axis indicates the achievable delay, the curve 801 corresponds to a high hand application, and the curve 802 corresponds to a low band application. As could be observed in FIG. 8, with the same amount of activated stages, the user only needs to disable some of the inverter cells in one inverter cell array, the achievable delay of the delay line circuit 400 may be correspondingly changed to a higher delay.

For example, if the amount of the activated stages is 5 in the high band application, the achievable delay would be around 250 ps. In this case, the user may disable some of the inverter cells in one inverter cell array to change the achievable delay to be 500 ps, i.e., the achievable delay where 5 stages are activated in the low band application.

That is, the delay line circuit 400 may change the achievable delay by changing the number of enabled inverter cells without changing the amount of activated stages, which improves the variety of applications of the delay line circuit 400.

In accordance with some embodiments, the proposed delay line circuit with a switch capacitor array disposed at the input terminal of the output inverter may be able to correct the duty cycle by itself, and hence no additional duty cycle correction circuit is needed. Further, by replacing the inverter cell with a inverter cell array including parallelly connected inverter cells, the delay line circuit may change the achievable delay without changing the activated stages, which improves the variety of applications of the proposed delay line circuit.

In accordance with some embodiments, a delay line circuit including an output stage is introduced. The output stage includes a first inverter cell, a second inverter cell, a correction circuit, and a first switch capacitor array. The first inverter cell has an input terminal and an output terminal, wherein the input terminal of the first inverter cell receives a reference clock signal. The second inverter cell has an input terminal and an output terminal, wherein the input terminal of the second inverter cell is coupled with the output terminal of the first inverter cell. The correction circuits has a first terminal and a second terminal, wherein the first terminal of the correction circuit is coupled with the output terminal of the first inverter cell, and the second terminal of the correction circuit is coupled with a ground, wherein the correction circuit corrects a duty cycle of the delay line circuit. The first switch capacitor array has a first terminal and a second terminal, wherein the first terminal of the first switch capacitor array is coupled with the output terminal of the second inverter cell, and the second terminal of the first switch capacitor array is coupled with the ground.

In accordance with some embodiments, a delay line circuit including an output stage is introduced. The output stage includes a first inverter cell array, a second inverter cell array, a correction circuit, and a first switch capacitor array. The first inverter cell array includes a plurality of inverter cells connected in parallel and has an input terminal and an output terminal, wherein the input terminal of the first inverter cell array receives a reference clock signal. The second inverter cell has an input terminal and an output terminal, wherein the input terminal of the second inverter cell is coupled with the output terminal of the first inverter cell array, wherein an achievable delay of the delay line circuit is configurable via changing a number of enabled inverter cells in the inverter cells. The correction circuits has a first terminal and a second terminal, wherein the first terminal of the correction circuit is coupled with the output terminal of the first inverter cell, and the second terminal of the correction circuit is coupled with a ground, wherein the correction circuit corrects a duty cycle of the delay line circuit. The first switch capacitor array has a first terminal and a second terminal, wherein the first terminal of the first switch capacitor array is coupled with the output terminal of the second inverter cell, and the second terminal of the first switch capacitor array is coupled with the ground.

In accordance with some embodiments, a delay line circuit including an output stage and a plurality of serially connected stages coupled with the output stage is introduced. The output stage includes a first inverter cell array, a second inverter cell array, a correction circuit, and a first switch capacitor array. The first inverter cell has an input terminal and an output terminal, wherein the input terminal of the first inverter cell receives a reference clock signal. The second inverter cell array includes a plurality of inverter cells connected in parallel and has an input terminal and an output terminal, wherein the input terminal of the second inverter cell array is coupled with the output terminal of the first inverter cell array, wherein an achievable delay of the delay line circuit is configurable via changing a number of enabled inverter cells in the inverter cells. The correction circuits has a first terminal and a second terminal, wherein the first terminal of the correction circuit is coupled with the output terminal of the first inverter cell, and the second terminal of the correction circuit is coupled with a ground, wherein the correction circuit corrects a duty cycle of the delay line circuit. The first switch capacitor array has a first terminal and a second terminal, wherein the first terminal of the first switch capacitor array is coupled with the output terminal of the second inverter cell, and the second terminal of the first switch capacitor array is coupled with the ground.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A delay line circuit, comprising:
  an output stage, comprising:
    a first inverter cell, having an input terminal and an output terminal, wherein the input terminal of the first inverter cell receives a reference clock signal;
    a second inverter cell, having an input terminal and an output terminal, wherein the input terminal of the second inverter cell is coupled with the output terminal of the first inverter cell;
    a correction circuit, having a first terminal and a second terminal, wherein the first terminal of the correction circuit is coupled with the output terminal of the first inverter cell, and the second terminal of the correction circuit is coupled with a ground, wherein the correction circuit corrects a duty cycle of the delay line circuit; and
    a first switch capacitor array, having a first terminal and a second terminal, wherein the first terminal of the first switch capacitor array is coupled with the output terminal of the second inverter cell, and the second terminal of the first switch capacitor array is coupled with the ground, wherein the correction circuit comprises a second switch capacitor array, the second switch capacitor array comprises a plurality of switch capacitor units, and each switch capacitor unit comprises:
      a capacitor, having a first end and a second end, wherein the first end of the capacitor forms the first terminal of the correction circuit and is coupled with the output terminal of the first inverter cell;
      a switch, having a first end and a second end, wherein the first end of the switch is coupled with the second end of the capacitor, and the second end of the switch is coupled with the ground.

2. The delay line circuit according to claim 1, wherein the delay line circuit is a digitally-controlled delay line circuit.

3. The delay line circuit according to claim 1, further comprising a plurality of serially connected stages coupled with the output stage, wherein each stage has a first input terminal, a first output terminal, a second input terminal, and a second output terminal.

4. The delay line circuit according to claim 3, wherein for a $1^{st}$ stage of the stages, the first input terminal of the $1^{st}$ stage is coupled with the input terminal of the first inverter cell, the first output terminal of the $1^{st}$ stage is coupled with the first input terminal of a $2^{nd}$ stage of the stages, the second input terminal of the $1^{st}$ stage is coupled with the second output terminal of the $2^{nd}$ stage, and the second output terminal of the $1^{st}$ stage is coupled with the output terminal of the first inverter cell.

5. The delay line circuit according to claim 3, wherein for an $i^{th}$ stage of the stages, the first input terminal of the $i^{th}$ stage is coupled with the first output terminal of an $(i-1)^{th}$ stage of the stages, the first output terminal is coupled with the first input terminal of an $(i+1)^{th}$ stage of the stages, the second input terminal of the $i^{th}$ stage is coupled with the second output terminal of the $(i+1)^{th}$ stage, and the second output terminal of the $i^{th}$ stage is coupled with the second input terminal of the $(i-1)^{th}$ stage.

6. The delay line circuit according to claim 5, wherein i is an integer ranges between 2 and a number of the stages.

7. The delay line circuit according to claim 3, wherein each stage comprises:
  a third inverter cell, having an input terminal and an output terminal, wherein the input terminal of the third inverter cell forms the first input terminal of the respective stage, the output terminal of the third inverter cell forms the first output terminal of the respective stage;
  a fourth inverter cell, having an input terminal and an output terminal, wherein the input terminal of fourth inverter cell is coupled with the output terminal of the third inverter cell, the output terminal of the fourth inverter cell forms the second input terminal of the respective stage;
  a fifth inverter cell, having an input terminal and an output terminal, wherein the input terminal of the fifth inverter cell is coupled with the output terminal of the fourth inverter cell, and the output terminal of the fifth inverter cell forms the second output terminal of the respective stage.

8. The delay line circuit according to claim 1, wherein the correction circuit comprises a second switch capacitor array identical to the first switch capacitor array.

9. A delay line circuit, comprising:
an output stage, comprising:
a first inverter cell array, comprising a plurality of inverter cells connected in parallel and having an input terminal and an output terminal, wherein the input terminal of the first inverter cell array receives a reference clock signal;
a second inverter cell, having an input terminal and an output terminal, wherein the input terminal of the second inverter cell is coupled with the output terminal of the first inverter cell array, wherein an achievable delay of the delay line circuit is configurable via changing a number of enabled inverter cells in the inverter cells;
a correction circuit, having a first terminal and a second terminal, wherein the first terminal of the correction circuit is coupled with the output terminal of the first inverter cell array, and the second terminal of the correction circuit is coupled with a ground, wherein the correction circuit corrects a duty cycle of the delay line circuit; and
a first switch capacitor array, having a first terminal and a second terminal, wherein the first terminal of the first switch capacitor array is coupled with the output terminal of the second inverter cell, and the second terminal of the first switch capacitor array is coupled with the ground, wherein the correction circuit comprises a second switch capacitor array, the second switch capacitor array comprises a plurality of switch capacitor units, and each switch capacitor unit comprises:
a capacitor, having a first end and a second end, wherein the first end of the capacitor forms the first terminal of the correction circuit and is coupled with the output terminal of the first inverter cell array;
a switch, having a first end and a second end, wherein the first end of the switch is coupled with the second end of the capacitor, and the second end of the switch is coupled with the ground.

10. The delay line circuit according to claim 9, wherein the delay line circuit is a digitally-controlled delay line circuit.

11. The delay line circuit according to claim 9, further comprising a plurality of serially connected stages, wherein each stage has a first input terminal, a first output terminal, a second input terminal, and a second output terminal.

12. The delay line circuit according to claim 11, wherein for a $1^{st}$ stage of the stages, the first input terminal of the $1^{st}$ stage is coupled with the input terminal of the first inverter cell array, the first output terminal is coupled with the first input terminal of a $2^{nd}$ stage of the stages, the second input terminal of the $1^{st}$ stage is coupled with the second output terminal of the $2^{nd}$ stage, and the second output terminal of the $1^{st}$ stage is coupled with the output terminal of the first inverter cell array.

13. The delay line circuit according to claim 11, wherein for an $i^{th}$ stage of the stages, the first input terminal of the $i^{th}$ stage is coupled with the first output terminal of an $(i-1)^{th}$ stage of the stages, the first output terminal is coupled with the first input terminal of an $(i+1)^{th}$ stage of the stages, the second input terminal of the $i^{th}$ stage is coupled with the second output terminal of the $(i+1)^{th}$ stage, and the second output terminal of the $i^{th}$ stage is coupled with the second input terminal of the $(i-1)^{th}$ stage.

14. The delay line circuit according to claim 13, wherein i is an integer ranges between 2 and a number of the stages.

15. The delay line circuit according to claim 11, wherein each stage comprises:
a third inverter cell, having an input terminal and an output terminal, wherein the input terminal of the third inverter cell forms the first input terminal of the respective stage, the output terminal of the third inverter cell forms the first output terminal of the respective stage;
a fourth inverter cell, having an input terminal and an output terminal, wherein the input terminal of fourth inverter cell is coupled with the output terminal of the third inverter cell, the output terminal of the fourth inverter cell forms the second input terminal of the respective stage;
a fifth inverter cell, having an input terminal and an output terminal, wherein the input terminal of the fifth inverter cell is coupled with the output terminal of the fourth inverter cell, and the output terminal of the fifth inverter cell forms the second output terminal of the respective stage.

16. A delay line circuit, comprising:
an output stage, comprising:
a first inverter cell, having an input terminal and an output terminal, wherein the input terminal of the first inverter cell receives a reference clock signal;
a second inverter cell array, comprising a plurality of inverter cells connected in parallel and having an input terminal and an output terminal, wherein the input terminal of the second inverter cell array is coupled with the output terminal of the first inverter cell, wherein an achievable delay of the delay line circuit is configurable via changing a number of enabled inverter cells in the inverter cells;
a correction circuit, having a first terminal and a second terminal, wherein the first terminal of the correction circuit is coupled with the output terminal of the first inverter cell, and the second terminal of the correction circuit is coupled with a ground, wherein the correction circuit corrects a duty cycle of the delay line circuit; and
a first switch capacitor array, having a first terminal and a second terminal, wherein the first terminal of the first switch capacitor array is coupled with the output terminal of the second inverter cell array, and the second terminal of the first switch capacitor array is coupled with the ground, wherein the correction circuit comprises a second switch capacitor array, the second switch capacitor array comprises a plurality of switch capacitor units, and each switch capacitor unit comprises:
a capacitor, having a first end and a second end, wherein the first end of the capacitor forms the first terminal of the correction circuit and is coupled with the output terminal of the first inverter cell array;
a switch, having a first end and a second end, wherein the first end of the switch is coupled with the second end of the capacitor, and the second end of the switch is coupled with the ground.

17. The delay line circuit according to claim 16, wherein the delay line circuit is a digitally-controlled delay line circuit.

18. The delay line circuit according to claim 16, further comprising a plurality of serially connected stages, wherein each stage has a first input terminal, a first output terminal, a second input terminal, and a second output terminal.

19. The delay line circuit according to claim 18, wherein for a $1^{st}$ stage of the stages, the first input terminal of the $1^{st}$ stage is coupled with the input terminal of the first inverter cell array, the first output terminal is coupled with the first input terminal of a $2^{nd}$ stage of the stages, the second input terminal of the $1^{st}$ stage is coupled with the second output terminal of the $2^{nd}$ stage, and the second output terminal of the $1^{st}$ stage is coupled with the output terminal of the first inverter cell array.

20. The delay line circuit according to claim 18, wherein for an $i^{th}$ stage of the stages, the first input terminal of the $i^{th}$ stage is coupled with the first output terminal of an $(i-1)^{th}$ stage of the stages, the first output terminal is coupled with the first input terminal of an $(i+1)^{th}$ stage of the stages, the second input terminal of the $i^{th}$ stage is coupled with the second output terminal of the $(i+1)^{th}$ stage, and the second output terminal of the $i^{th}$ stage is coupled with the second input terminal of the $(i-1)^{th}$ stage.

* * * * *